(12) United States Patent
Lin et al.

(10) Patent No.: US 8,368,085 B2
(45) Date of Patent: Feb. 5, 2013

(54) SEMICONDUCTOR PACKAGE

(75) Inventors: Hung-Chin Lin, Hsinchu (TW); Kuo-Fu Peng, Hsinchu (TW); Chien-Min Chen, Hsinchu (TW); Ko-Wei Chien, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 332 days.

(21) Appl. No.: 12/903,116

(22) Filed: Oct. 12, 2010

(65) Prior Publication Data
US 2011/0156085 A1      Jun. 30, 2011

(30) Foreign Application Priority Data
Dec. 30, 2009   (CN) .......................... 2009 1 0215215

(51) Int. Cl.
*H01L 27/15* (2006.01)
*H01L 33/00* (2010.01)

(52) U.S. Cl. ............................. 257/79; 257/99; 257/676

(58) Field of Classification Search .................... 257/99, 257/79, 676
See application file for complete search history.

(56) References Cited

U.S. PATENT DOCUMENTS

| 7,655,957 | B2 | 2/2010 | Loh et al. | |
|---|---|---|---|---|
| 2007/0253209 | A1* | 11/2007 | Loh et al. | 362/458 |
| 2007/0284589 | A1* | 12/2007 | Ng et al. | 257/79 |
| 2008/0296599 | A1* | 12/2008 | Mazzochette | 257/98 |
| 2009/0065799 | A1* | 3/2009 | Kim et al. | 257/99 |
| 2009/0121777 | A1* | 5/2009 | Nakajima | 327/493 |

FOREIGN PATENT DOCUMENTS

| CN | 1684278 A | 10/2005 |
|---|---|---|
| CN | 101432896 A | 5/2009 |

* cited by examiner

*Primary Examiner* — Long Tran
(74) *Attorney, Agent, or Firm* — Altis Law Group, Inc.

(57) ABSTRACT

A semiconductor package includes at least four lead frames each having an extending portion and a connecting portion, a heat dissipation plate having a top surface and a bottom surface, at least one semiconductor chip positioned on the top surface of the heat dissipation plate. At least one conductive wire electrically connects the chip to the lead frames. An encapsulation covers the lead frames, the heat dissipation plate, the semiconductor chip, and the conductive wires, while the bottom surface of the heat dissipation plate and the extending portions of the lead frames are exposed.

18 Claims, 7 Drawing Sheets

SEMICONDUCTOR PACKAGE

BACKGROUND

1. Technical Field

The disclosure relates to semiconductor package, and particularly to a semiconductor package including light emitting diode.

2. Description of the Related Art

Light emitting diodes' (LEDs) many advantages, such as high luminosity, low operational voltage, low power consumption, compatibility with integrated circuits, easy driving, long term reliability, and environmental friendliness have promoted their wide use as a light source. Now, light emitting diodes are commonly applied in environmental lighting.

FIG. 1 shows a cross sectional view of a surface-mounted device (SMD) type LED package in accordance with related art. Referring to FIG. 1, the SMD LED package 100 includes a lead frame 102. The lead frame 102 includes a support portion 102a and an extending portion 102b. A LED chip 110 is mounted on the surface of the support portion 102a. The LED chip 110 includes a positive electrode and a negative electrode (not shown) electrically connecting to the lead frame 102 with conductive wires 112a and 112b.

The SMD LED package 100 further includes a package shell 120 including polycarbonate (PC) resin and $TiO_2$. The lead frame 102 is embedded in the package shell 120 by an insert molding process. The extending portion 102b extending and exposed outside the package shell 120 is used for electrical connection. An epoxy, silicone, or transparent material is filled into the package shell 120 and forms a glue 122 having a function of protection.

The heat from the SMD LED is conducted through the lead frames 102 to the environment. Thus, increasing the surface area of the extending portion 102b of the lead frames 102 and the package structure increases the heat dissipating surface and decreases the thermal resistance of the extending portion 102b. However, with increasing of the power of the SMD LED package, only increasing the surface area of the extending portion 102b is not enough for requirement of heat dissipation of the SMD LED. Furthermore, utilizing the lead frames 102 as the heat dissipating path, the electrical performance of the SMD LED is affected by the heat from the SMD LED.

Therefore, it is desirable to provide a semiconductor package which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present semiconductor package. Moreover, in the drawings, like reference numerals designate corresponding parts throughout the views.

DETAILED DESCRIPTION

Embodiments of a semiconductor package as disclosed are described in detail here with reference to the drawings.

Figure 1:
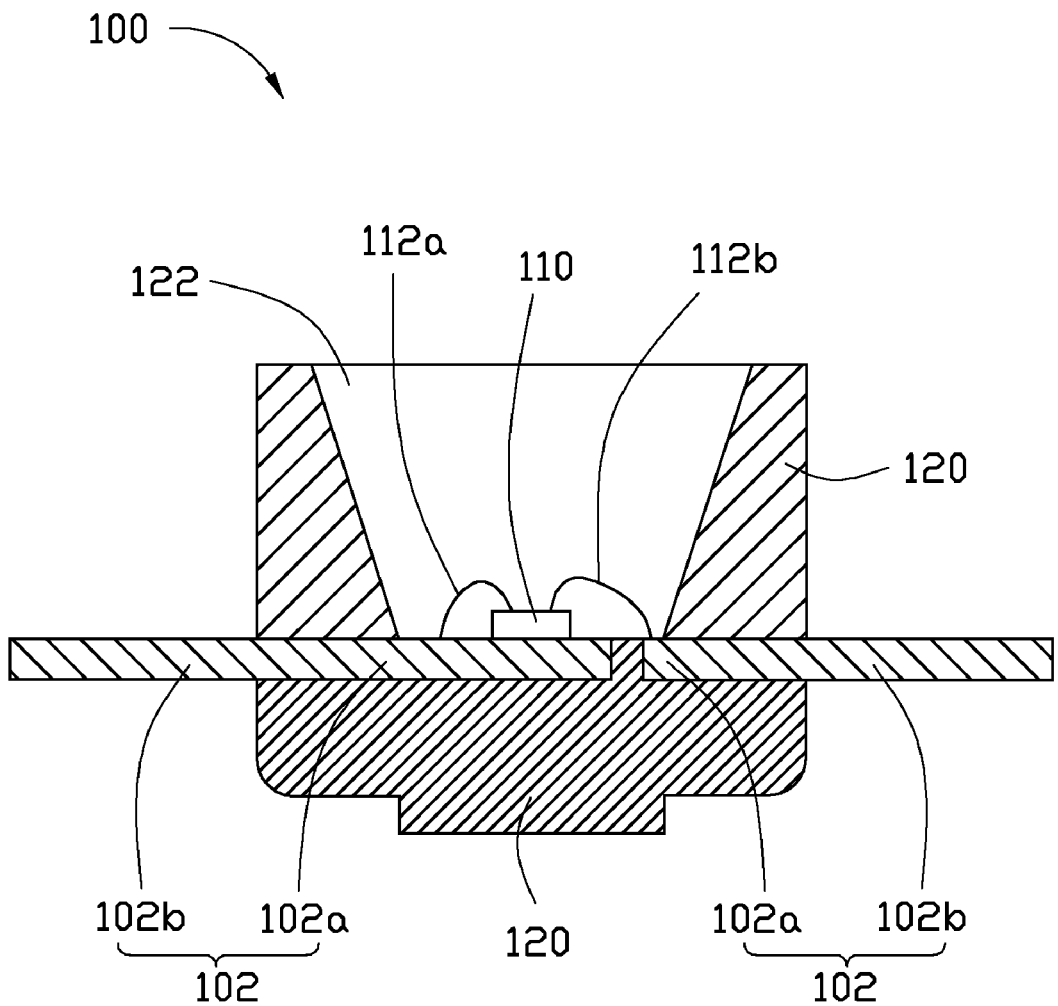
FIG. 1 is a cross sectional view of a surface-mounted device type LED package in accordance with related art.
Figure 2:
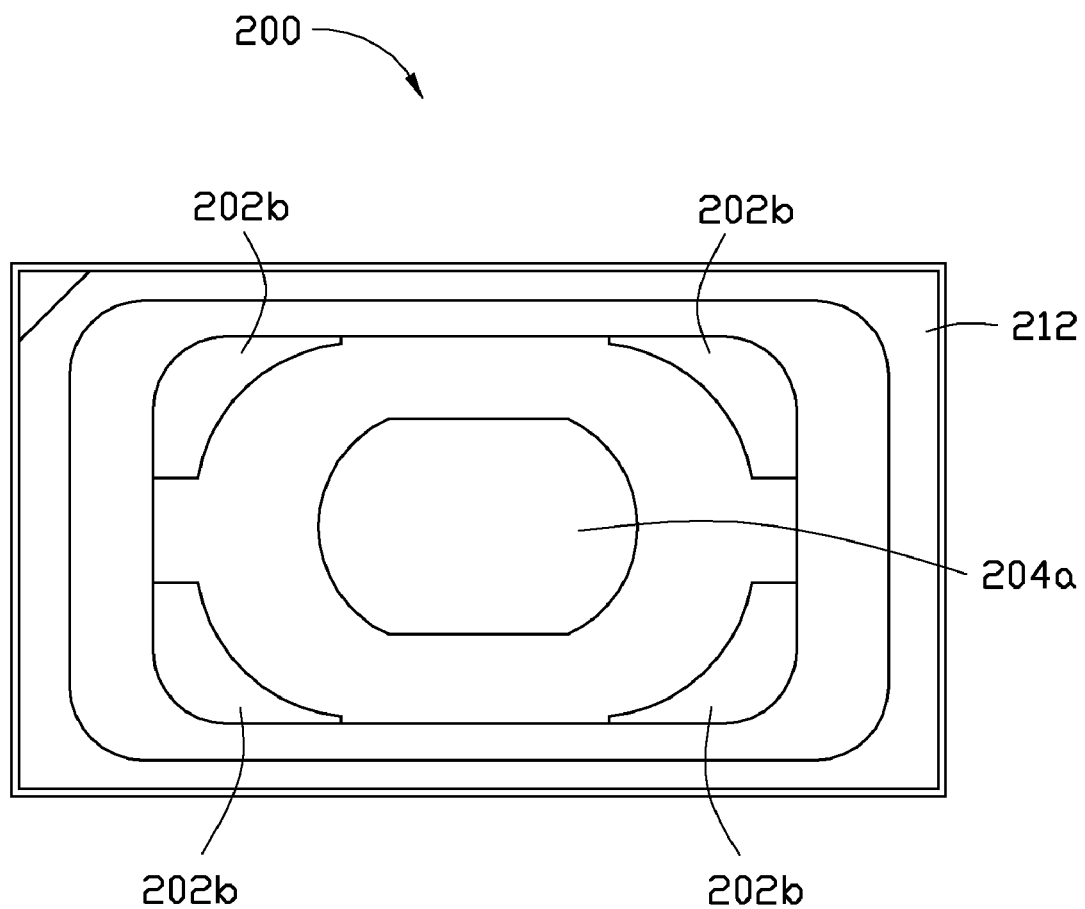
FIG. 2 is a top view of a semiconductor package in accordance with a first embodiment of the present disclosure.
Figure 3:
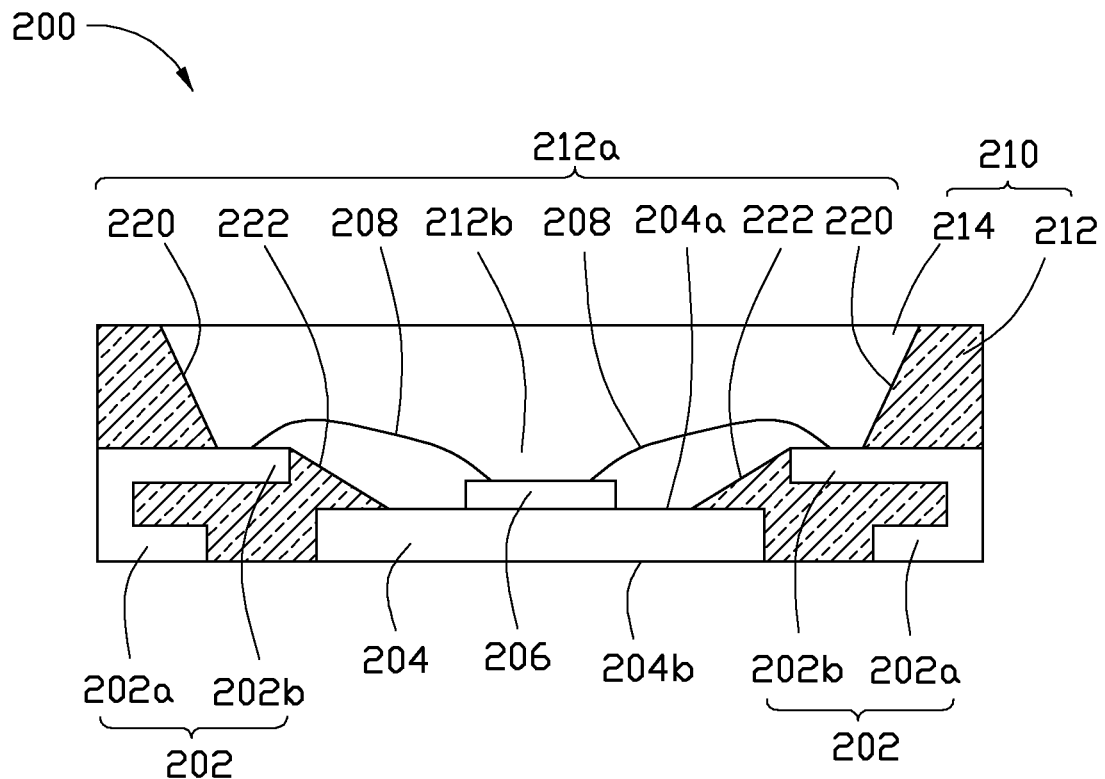
FIG. 3 is a cross sectional view of the semiconductor package in accordance with the first embodiment.
Figure 4:
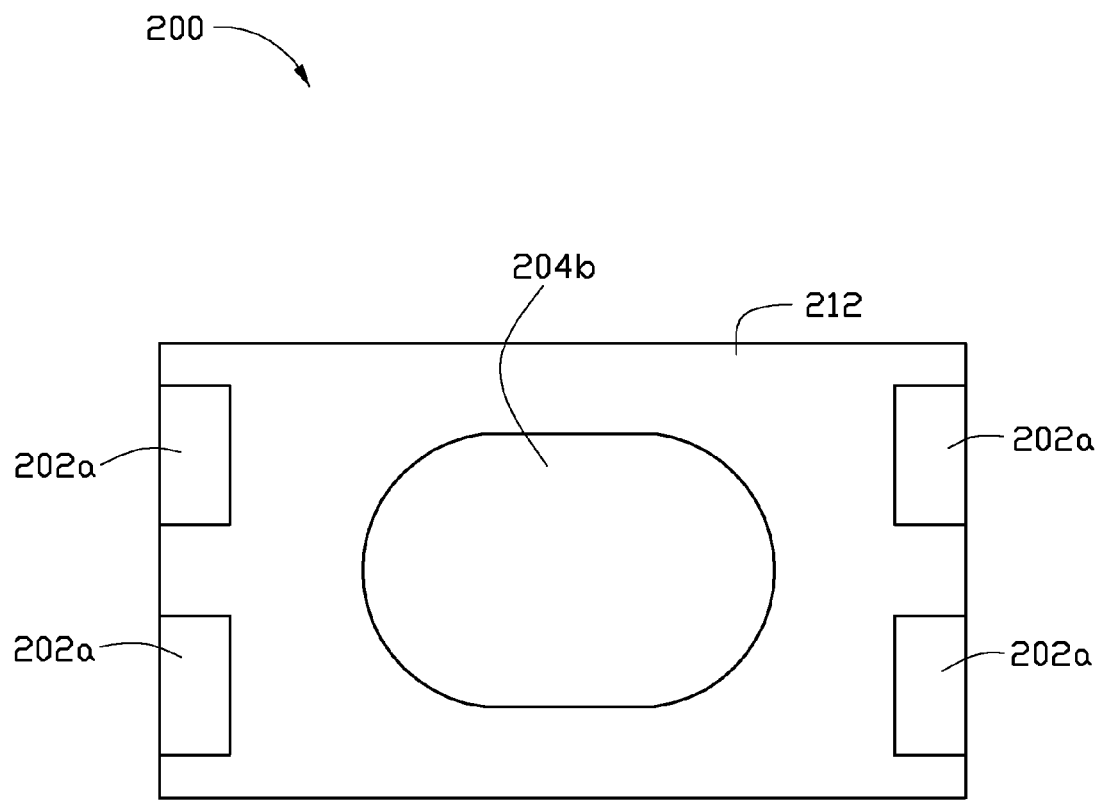
FIG. 4 is a bottom view of the semiconductor package of FIG. 2.

Referring to FIGS. 2 to 4, FIG. 2 shows a top view of a semiconductor package 200 of a first embodiment. FIG. 4 shows a bottom view of the semiconductor package 200 of the first embodiment. FIG. 3 shows the cross sectional view of the semiconductor package 200 of the first embodiment. The semiconductor package 200 has at least four lead frames 202 each having an extending portion 202a and a connecting portion 202b. The lead frames 202 further include a reflective layer (not shown) enhancing the reflective efficiency. The semiconductor package 200 further includes a heat dissipation plate 204 having a top surface 204a and a bottom surface 204b. The heat dissipation plate 204 includes a metal material or non-metal material. The metal material can be gold, silver, copper, aluminum, or an alloy thereof. The non-metal material can be silicon, ceramic, graphite, or a combination thereof.

In this embodiment, a LED chip 206 is mounted on the top surface 204a of the heat dissipating plate 204. The LED chip 206 in accordance with the first embodiment includes a semiconductor multiple layer, a positive electrode and a negative electrode (not shown). The semiconductor multiple layer includes an n-type semiconductor layer, a p-type semiconductor layer, and an active layer between the n-type semiconductor layer and the p-type semiconductor layer.

The semiconductor package 200 further includes at least one conductive wire 208 electrically connecting the LED chip 206 and the connecting portion 202b of the lead frame 202. The semiconductor package 200 further includes an encapsulation 210 covering the lead frames 202, the heat dissipation plate 204, the LED chip 206, and the conductive wire 208. The extending portion 202a of the lead frame 202 and the bottom surface 204b of the heat dissipating plate 204 are exposed to the outside of the encapsulation 210.

Referring to FIG. 2 to FIG. 4, the encapsulation 210 further includes a shell 212 and a transparent portion 214. The shell 212 can be polycarbonate (PC), noryl, polybutylene terephthalate (PBT), polyphthalamide (PPA), polypropylene (PP), polymethyl methacrylate (PMMA), glass fiber, $TiO_2$, $CaCO_3$, or a combination thereof. The transparent portion 214 can include epoxy or silicone. According to the color of light needed from the semiconductor package 200, the LED transparent portion 214 further can include yellow phosphor powder, red phosphor powder, green phosphor powder, or a combination thereof.

Referring to FIGS. 2 and 3, the shell 212 covers the connecting portion 202b of the lead frame 202 and the top surface 204a of the heat dissipation plate 204. In other words, the extending portion 202a of the lead frame 202 extending and exposed outside of the shell 212 is used for electrical connection. The bottom surface 204b of the heat dissipation plate 204 is exposed outside of the bottom of the shell 212.

The heat from the LED chip 206 dissipates through the heat dissipation plate 204. The electrical connecting path is formed by the conductive wire 208 and the lead frames 202. That can avoid heat affecting the electrical performance during the operation. This is a concept of the heat-electricity separating method. The heat dissipation plate 204 can be material having high thermal conductivity efficiency, such as copper (401 W/m·K), silicon (170 W/m·K), gold (318 W/m·K), silver (429 W/m·K), or aluminum (237 W/m·K); the heat dissipation plate 204 can be graphite or ceramic (500-900 W/m·K). Because the LED chip 206 is directly mounted on the top surface 204a of the heat dissipation plate 204 having high thermal conductivity efficiency, the heat dissipation plate 204 is directly exposed to the bottom of the shell 212. The heat from the LED chip 206 can directly dissipate out of the semiconductor package 200 through the heat dissipation plate 204. That can increase effectively the heat dissipation efficiency of the semiconductor package 200.

Referring to FIGS. 2 to 4, the shell 212 of the encapsulation 210 further includes a first recess 212a and a second recess 212b. The second recess 212b is arranged at the center of the first recess 212a and is lower than the first recess 212a. The heat dissipation plate 204 is mounted on the bottom of the second recess 212b, and the lead frame 202 is mounted on the bottom of the first recess 212a. The extending portion 202a is extending and exposed outside of the shell 210 (as shown in FIG. 4). The shell 210 bending downward is embedded in the bottom of the second recess 212b. The semiconductor package 200 is substantially cubic. Because the lead frames 202 and the heat dissipation plate 204 are mounted on different planes, the heat dissipation plate 204 does not occupy the space of the lead frame 202. It utilizes the double recesses 212a and 212b, thus enhances the seal of the encapsulation 210 and the lead frame 202.

Figure 5:
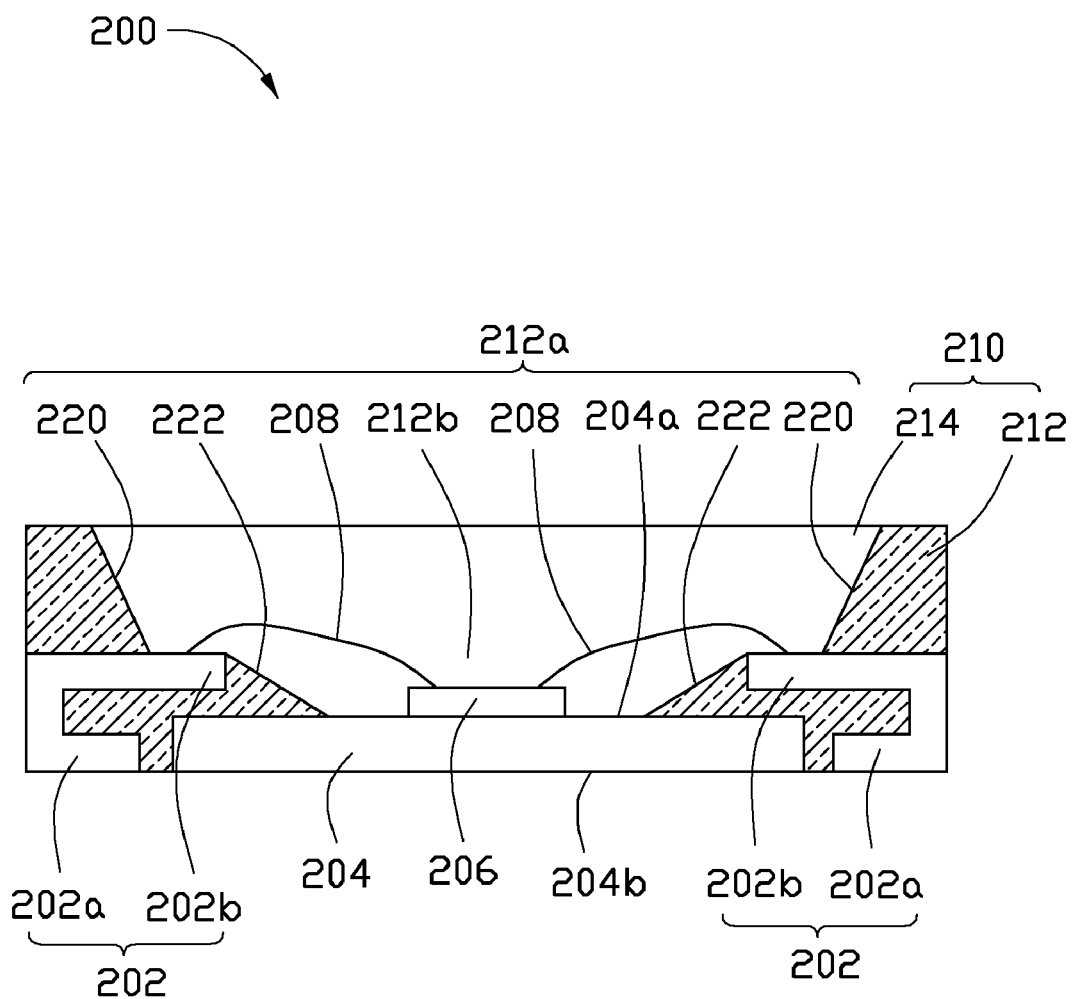
FIG. 5 is a cross sectional view of a semiconductor package in accordance with a second embodiment.

FIG. 5 in accordance with a second embodiment, shows a cross sectional view of the semiconductor package 200. The heat dissipation plate 204 is mounted on the bottom of the second recess 212b. The lead frame 202 is mounted on the bottom of the first recess 212a. The heat dissipation plate 204 and the lead frames 202 are mounted on different planes. Thus, the heat dissipating plate 204 extends into the below space of the connecting portion 202b of the lead frames 202 and overlaps with the connecting portion 202b, but does not directly contact with the connecting portion 202b and the extending portion 202a. The semiconductor package 200 includes the heat dissipation plate 204 having a larger dissipation area which enhances the heat dissipation efficiency.

The first recess 212a has a first inclined surface 220, and the second recess 212b has a second inclined surface 222. The slope of the first inclined surface 220 is preferably larger than the second inclined surface 222 of the second recess 212b. Utilizing the double inclined surfaces, having different slopes, can focus the light from the LED chip 206 and enhance the light emitting efficiency of the semiconductor package 200.

Figure 6:
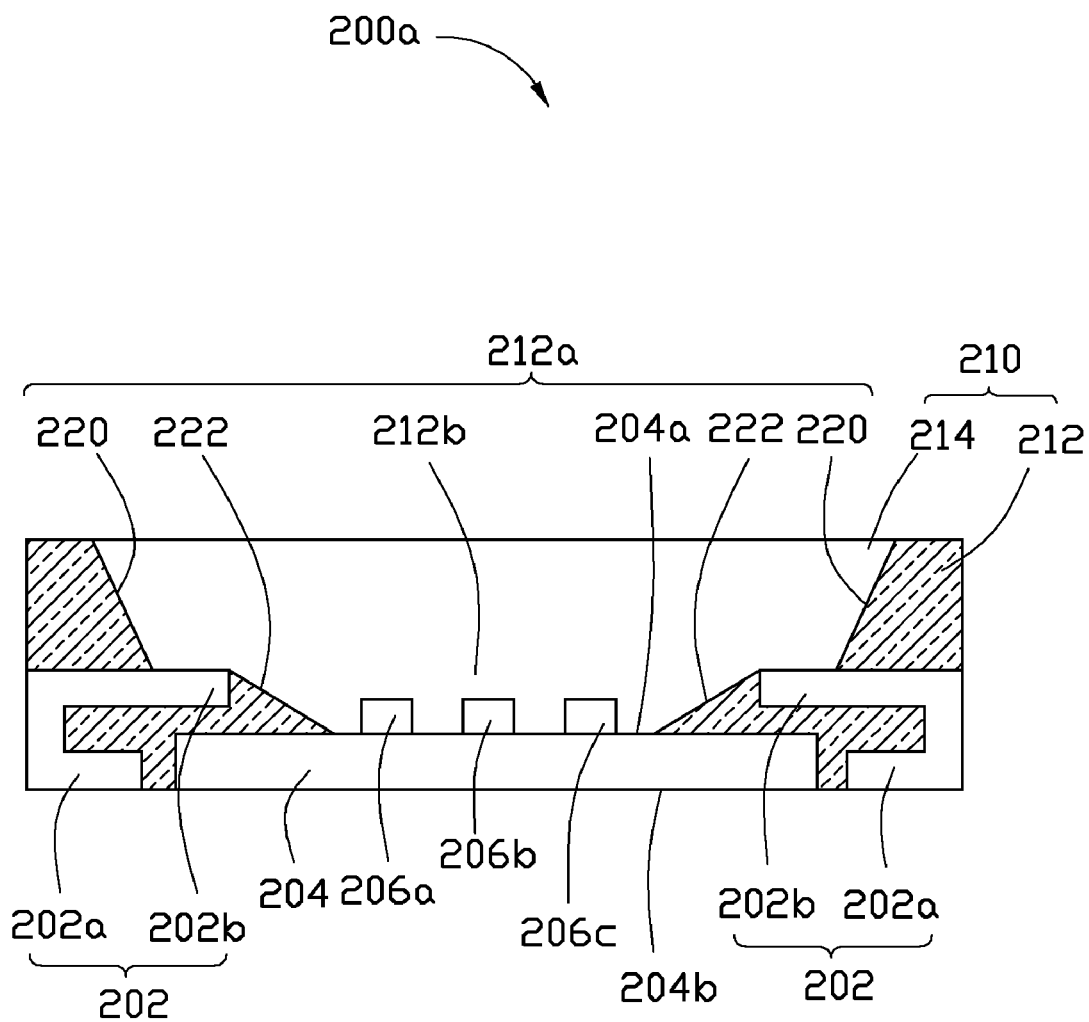
FIG. 6 is a cross sectional view of a semiconductor package in accordance with a third embodiment.

FIG. 6 shows a cross sectional view of a semiconductor package 200a in accordance with a third embodiment. The only difference from the first embodiment is that a number of LED chips 206a, 206b, and 206c are mounted on the heat dissipation plate 204 and a conductive wire (not shown) connects to the LED chips 206a, 206b, and 206c, and the lead frames 202. Because the heat dissipation plate 204 has a higher thermal conductivity efficiency, it provides a heat dissipating path. The embodiment provides the semiconductor package 200a further encapsulating a number of LED chips. The semiconductor package 200a does not accumulate heat in the LED chips during operation. The number of LED chips is not limited to FIG. 6.

Figure 7:
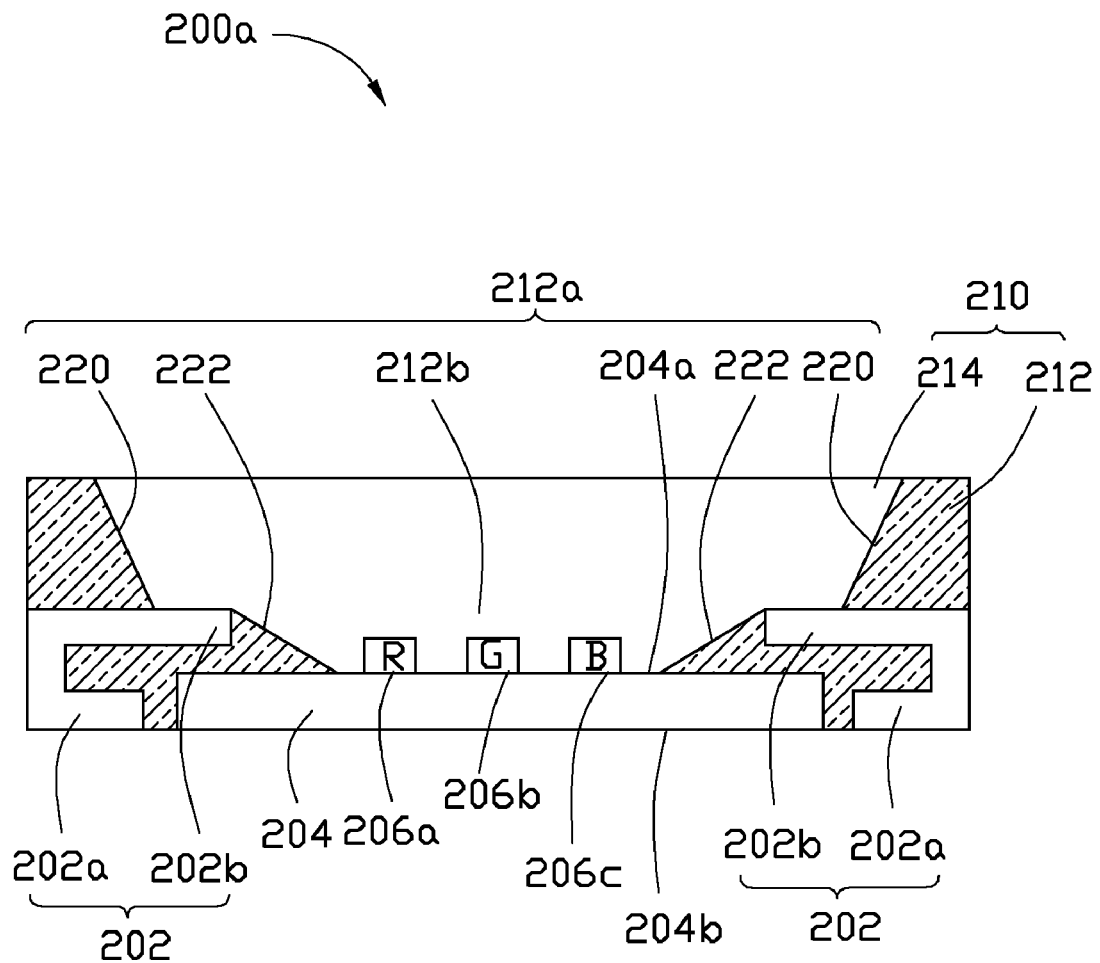
FIG. 7 is a cross sectional view of a semiconductor package in accordance with a fourth embodiment.

FIG. 7 shows a cross sectional view of a semiconductor package in accordance with a fourth embodiment. The LED chips 206a, 206b, and 206c are respectively, red, green, and blue LED chips. The semiconductor package 200a according to need, having phosphor powders in the transparent portion 214 can be a semiconductor package with multiple wavelength or white light.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
   four lead frames, each lead frame respectively having an extending portion and a connecting portion;
   a heat dissipation plate having a top surface and a bottom surface;
   at least one semiconductor chip mounted on the top surface of the heat dissipation plate;
   at least one conductive wire electrically connecting the at least one semiconductor chip and the connecting portion of each of the lead frames; and
   an encapsulation covering the lead frames, the heat dissipation plate, the at least one semiconductor chip and the at least one conductive wire, wherein the bottom surface of the heat dissipation plate and the extending portion of each of the lead frames are exposed outside of the encapsulation;
   wherein the encapsulation further includes a shell and a transparent portion;
   wherein the shell further includes a first recess and a second recess; and
   wherein the lead frame is mounted on the bottom of the first recess and the heat dissipation plate is mounted on the bottom of the second recess.

2. A semiconductor package, comprising:
   four lead frames, each lead frame respectively having an extending portion and a connecting portion;
   a heat dissipation plate having a top surface and a bottom surface;
   at least one semiconductor chip mounted on the top surface of the heat dissipation plate;
   at least one conductive wire electrically connecting the at least one semiconductor chip and the connecting portion of each of the lead frames; and
   an encapsulation covering the lead frames, the heat dissipation plate, the at least one semiconductor chip and the at least one conductive wire, wherein the bottom surface of the heat dissipation plate and the extending portion of each of the lead frames are exposed outside of the encapsulations;
   wherein the encapsulation further includes a shell and a transparent portion;
   wherein the shell further includes a first recess and a second recess; and
   wherein the first recess includes a first inclined surface and the second recess includes a second inclined surface.

3. The semiconductor package of claim 2, wherein the at least one semiconductor chip is a LED chip.

4. The semiconductor package of claim 2, wherein the heat dissipation plate includes a metal material or non-metal material.

5. The semiconductor package of claims 4, wherein the metal material is gold, silver, copper, aluminum or an alloy thereof.

6. The semiconductor package of claims 4, wherein the non-metal material is graphite, silicon, ceramic, or a combination thereof.

7. The semiconductor package of claims 2, wherein the shell covers the top surface of the heat dissipation plate and a part of each of the lead frames.

8. The semiconductor package of claims 2, wherein the second recess is mounted at the center of the first recess and lower than the first recess.

9. The semiconductor package of claims 2, wherein the lead frame is mounted on the bottom of the first recess and the heat dissipation plate is mounted on the bottom of the second recess.

10. The semiconductor package of claims 2, wherein the slope of the first inclined surface exceeds that of the second inclined surface.

11. The semiconductor package of claims 2, wherein the shell is polycarbonate (PC), noryl, polybutylene terephthalate (PBT), polyphthalamide (PPA), polypropylene (PP), polymethyl methacrylate (PMMA), glass fiber, $TiO_2$, $CaCO_3$, or a combination thereof.

12. The semiconductor package of claims 2, wherein the transparent portion includes an epoxy or a silicone.

13. A LED package, comprising:
    at least one lead frame having an extending portion;
    a heat dissipation plate having a top surface and a bottom surface;
    at least one LED chip mounted on the top surface of the heat dissipation plate;
    at least one conductive wire electrically connecting the at least one LED chip and the at least one lead frame;
    an encapsulation including a transparent portion covering the at least one LED chip and the conductive wire; and
    a shell includes a first recess and a second recess, wherein the at least one lead frame is mounted on the bottom of the first recess and the heat dissipation plate is mounted on the bottom of the second recess.

14. The LED package of claims 13, wherein the heat dissipation plate includes a metal material or non-metal material.

15. The LED package of claims 14, wherein the metal material is gold, silver, copper, aluminum or an alloy thereof.

16. The LED package of claims 14, wherein the non-metal material is graphite, silicon, ceramic, or a combination thereof.

17. The LED package of claims 13, wherein the shell covers the top surface of the heat dissipation plate and a part of the at least one lead frame.

18. The LED package of claims 17, wherein the bottom surface of the heat dissipation plate and the extending portion of the at least one lead frame are exposed outside of the encapsulation.

* * * * *